United States Patent [19]
Eisenbeiser et al.

[11] Patent Number: 5,880,029
[45] Date of Patent: Mar. 9, 1999

[54] METHOD OF PASSIVATING SEMICONDUCTOR DEVICES AND THE PASSIVATED DEVICES

[75] Inventors: Kurt Eisenbeiser, Tempe; Jenn-Hwa Huang, Gilbert, both of Ariz.

[73] Assignee: Motorola, Inc., Schaumburg, Ill.

[21] Appl. No.: 775,054

[22] Filed: Dec. 27, 1996

[51] Int. Cl.$^6$ ................................................. H01L 21/316
[52] U.S. Cl. ..................... 438/694; 438/762; 438/767; 438/771
[58] Field of Search .................. 438/694, 762, 438/767, 771, 396, 624

[56] References Cited

U.S. PATENT DOCUMENTS

| | | | |
|---|---|---|---|
| H1041 | 4/1992 | Lux et al. | 437/235 |
| 4,950,624 | 8/1990 | Inuzima . | |
| 4,987,008 | 1/1991 | Yamazaki et al. | 438/694 |
| 5,021,365 | 6/1991 | Kirchner et al. | 438/767 |
| 5,620,910 | 4/1997 | Teramoto | 438/771 |

FOREIGN PATENT DOCUMENTS 62-7866  1/1987  Japan .

OTHER PUBLICATIONS

T. Matsuda et al., Jpn. J. Appl. Phys., 33(10)(Oct. 1994)5894 "Chemical composition . . . imporved by plasma and UV oxidation".

M.T. Schmidt et al., J. Vac. Sci. Technol. B 6(4)(Jul. 1988)1436 "Increased dependence of Schottky barrier . . . due to a thin oxide layer".

Z.H. Lu et al. J. Vac. Sci. Technol. B 11(6)(Nov. 1993) 2033 "Ultraviolet–ozone oxidation of GaAs(100) and InP(100)".

S.W. King et al., MRS Symp. Proc. 345 (1996) 739 Ex situ and In situ methods for oxide and carbon removal . . . , Nov. 1995.

*Primary Examiner*—Charles Bowers
*Assistant Examiner*—Matthew Whipple
*Attorney, Agent, or Firm*—Eugene A. Parsons; William E. Koch

[57] ABSTRACT

A method of passivating semiconductor devices including the steps of providing a semiconductor device having a surface of semiconductor material to be passivated, exposing the surface of semiconductor material to deep ultraviolet (DUV) radiation in an ambiance including oxygen so as to form a layer of oxide on the surface of semiconductor material, and forming a layer of passivation material on the layer of oxide. The DUV oxide forms a different interface with the semiconductor material which significantly improves operating characteristics of the semiconductor device.

12 Claims, 1 Drawing Sheet

5,880,029

METHOD OF PASSIVATING SEMICONDUCTOR DEVICES AND THE PASSIVATED DEVICES

FIELD OF THE INVENTION

This invention relates to compound semiconductor structures having a semiconductor-insulator interface and a method for passivating the semiconductor surface prior to deposition of an insulating material.

BACKGROUND OF THE INVENTION

Most semiconductor devices require an encapsulating passivation layer to improve their reliability. An insulator such as $Si_3N_4$ or $SiO_2$ is commonly used to passivate compound semiconductor surfaces. The interface between the semiconductor surface and the insulator, however, is poor due to dangling bonds, damage from the insulator deposition and differences in mechanical or physical properties, such as the coefficient of thermal expansion. This poor interface can lead to device problems such as surface leakage current and photogenerated current.

Several attempts have been made to improve this passivation process. One technique is to tie up the dangling bonds at the surface by such techniques as sulfidation or Se terminations. These techniques however have long term stability and process integration problems. Various oxides and nitrides formed by chemical reaction with the semiconductor surface have also been proposed to passivate compound semiconductor surfaces. These processes involve several complicated processing steps and require very precise control of the surface conditions to be successful. Both of these considerations limit their manufacturability.

In a semiconductor devices such as a field effect transistor (FET) properties such as leakage current, breakdown voltage, and saturation current can be affected by its surface properties. Similarly, in an heterostructure bipolar transistor (HBT) the surface properties can limit the gain of the transistor and in a diode the leakage current can be substantially increased. To alleviate these surface related problems a low leakage, stable, low damage process is needed to improve the semiconductor-insulator interface.

It is a purpose of the present invention to provide a new and improved method of passivating semiconductor devices.

It is another purpose of the present invention to provide a new and improved method of passivating semiconductor devices which is relatively simple and inexpensive to perform.

It is still another purpose of the present invention to provide a new and improved method of passivating semiconductor devices which improves various operating characteristics of the semiconductor devices.

It is a further purpose of the present invention to provide new and improved passivated semiconductor devices which are relatively simple and inexpensive to manufacture.

It is still a further purpose of the present invention to provide new and improved passivated semiconductor devices with improved operating characteristics.

SUMMARY OF THE INVENTION

The above problems and others are at least partially solved and the above purposes and others are realized in a method of passivating semiconductor devices, and the resulting semiconductor devices, including the steps of providing a semiconductor device having a surface of semiconductor material to be passivated, exposing the surface of semiconductor material to deep ultra-violet (DUV) radiation in an ambiance including oxygen so as to form a layer of DUV oxide on the surface of semiconductor material, and forming a layer of passivation material on the layer of DUV oxide. In most instances the surface of semiconductor material has a layer of native oxide formed thereon (by exposure to air or the like) and this layer of native oxide is removed prior to formation of the layer of DUV oxide. The DUV oxide forms a consistently good and reproducible interface with the semiconductor material which significantly improves operating characteristics of the semiconductor device.

BRIEF DESCRIPTION OF THE DRAWINGS

Referring to the drawings.

DESCRIPTION OF THE PREFERRED EMBODIMENT

Figure 1:
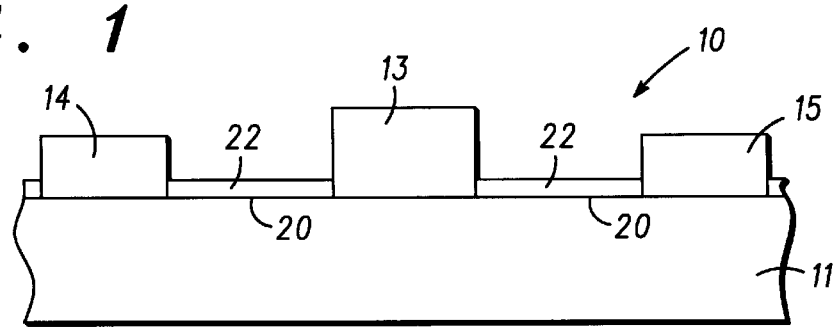
FIGS. 1 through 4 are simplified and enlarged cross-sectional views illustrating various steps in a process of passivating a semiconductor device in accordance with the present invention.

Turning now to the drawings in which like reference characters indicate corresponding elements throughout the several views, attention is first directed to FIG. 1 which illustrates a semiconductor device 10 on a semiconductor substrate 11, in accordance with the present invention. It should be understood that a gallium arsenide substrate 11 is utilized herein for purposes of this description but other III–V compounds and other semiconductor materials may be utilized in other applications. It should also be understood that substrate 11 might simply be a supporting structure, such as a wafer or the like, or it might include various layers formed on or in the supporting structure (e.g. epitaxially grown layers, implanted areas, etc.).

Semiconductor device 10, which in this specific embodiment is a field effect transistor, is formed on and/or in substrate 11 and includes a gate terminal 13, a source terminal 14, and a drain terminal 15. A semiconductor surface 20 is defined between electrodes 13, 14, and 15 of device 10 and in surrounding areas. It will of course be understood that electrodes 13, 14, and 15 might simply include metal contacts or, in the case of a heterostructure bipolar transistor, might include additional layers of semiconductor material formed on the surface of the substrate. Further, while semiconductor surface 20 is illustrated as appearing between and around electrodes 13, 14, and 15 for convenience of this description, in embodiments in which semiconductor material is included in the electrodes the following procedure applies equally to all such semiconductor surfaces.

Semiconductor surface 20 of gallium arsenide substrate 11 has a thin film 22 (generally 20 angstroms or less) of a native oxide which, as is well known in the art, forms generally instantaneously upon exposure to air. It should be understood that native oxide film 22 is not always necessary to the present invention and is only illustrated because it is generally present and requires special procedures to prevent. In some applications various types of passivation (not shown) may be used, to prevent the formation of film 22, in which case such passivation may have to be removed before the present procedure can be performed. It has been found that the present technique will operate generally as described with the semiconductor surface simply being clean (i.e. no foreign matter).

Figure 2:
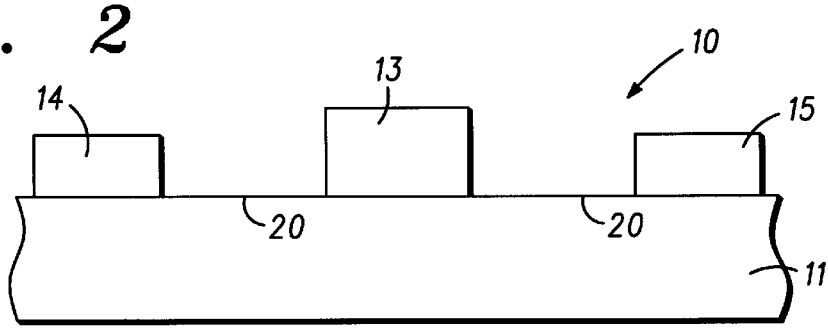

In some procedures, the removal of native oxide film 22 may depend upon subsequent steps in the procedure. For example, it has been found that one efficient procedure for removing native oxide film 22 is to heat the structure in a very low oxygen atmosphere to desorb the native oxide. As a specific example, substrate 11 is introduced into a growth chamber (not shown) and heated to a temperature of approximately 580° C. to desorb any native oxide, including layer 22, that may be present on semiconductor surface 20. Semiconductor device 10 on substrate 11 with clean, or native oxide-free, areas of semiconductor surface 20 is illustrated in FIG. 2.

Figure 3:
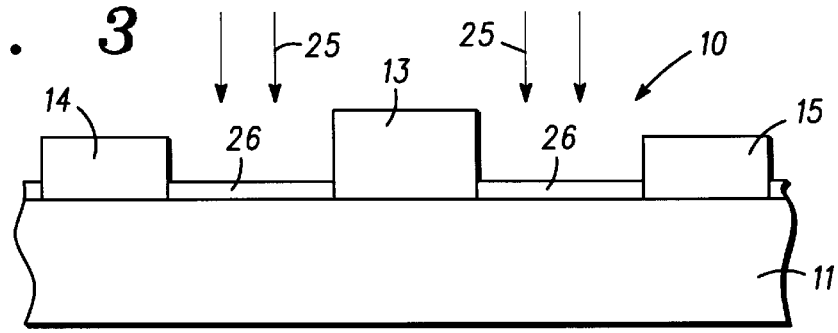

Semiconductor surface 20 of device 10 is then exposed to a bright light including deep ultraviolet, represented by arrows 25 in FIG. 3, in an ambiance or surrounding including oxygen. This can generally be accomplished without removing device 10 from the growth chamber, which substantially reduces the possibilities of introducing contaminants into the process. The bright light may be, for example, the type typically used in aligners, steppers, or E-beam devices in the semiconductor industry. The term "deep ultraviolet" refers to light in the ultraviolet range, generally with a wavelength in the range of 180 to 250 nanometers. In the present specific example, it is believed that a 185 nm light generates ozone due to optical excitation. The ozone then forms an oxide layer 26 on semiconductor surface 20. In some instances, it may be possible to desorb native oxide layer 22 and use the oxygen to form DUV oxide layer 26. In any case, oxide layer 26 is formed by subjecting semiconductor surface 20 to deep ultraviolet (DUV) radiation with oxygen present in the surrounding so that oxide layer 26 is referred to herein as DUV oxide. Therefore, it is believed that the excitation wavelength that is most suitable for efficient ozone generation is also the most efficient to use, although virtually any ultraviolet light will produce the desired result.

It is believed that exposure to other wavelengths, such as 248 nm in a specific example, modifies the composition of the DUV oxide by forming a different kind of oxide or complex oxide molecules that are more stable than the native oxide. The exposure to deep ultraviolet radiation can be performed under a lamp, however, when the light is collimated, as in an aligner or stepper, sharper features can be defined. In a specific example, standard bright lights, both at 185 nm and at 248 nm, were used to form DUV oxide film 26 with a thickness less than approximately 2 nm.

Figure 4:
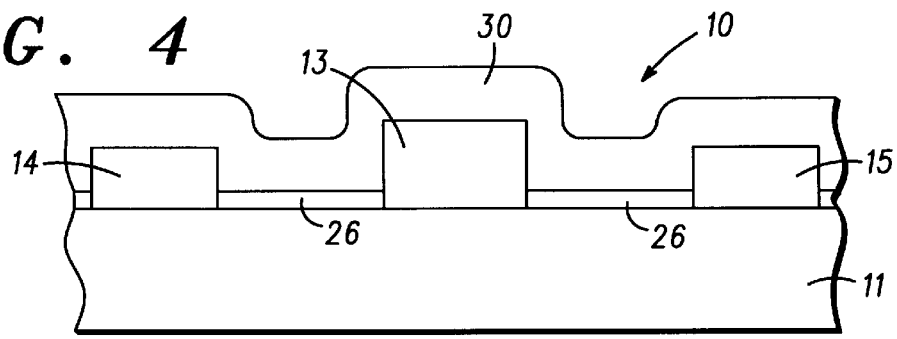

Once DUV oxide film 26 is grown, further processing operations, are easily performed in situ and ex situ as the oxide is very stable. The in situ aspect of this operation will be discussed presently. While retaining device 10 in the growth chamber, growth of passivation layer 30 overlying device 10 and DUV oxide film 26 is performed, as illustrated in FIG. 4. Passivation layer 30 includes any convenient passivation material such as one of $Si_3N_4$ or $SiO_2$. Further, it is most convenient for passivation layer 30 to be grown in situ in the growth chamber by some convenient process such as by plasma enhanced chemical vapor deposition. Thus, DUV oxide layer 26 forms an interface with semiconductor surface 20 and a second interface with passivation layer 30.

As stated above, the DUV oxide is a different form of oxide which forms a better bond with the semiconductor substrate. The DUV oxide protects the semiconductor surface from damage during plasma enhanced chemical vapor deposition of passivation layer 30. Further, the DUV oxide changes the surface mobility, surface states and/or recombination velocity to substantially improve semiconductor device operating characteristics.

When the steps of removing the native oxide layer, forming the DUV oxide layer, and forming the passivation layer are performed in situ without removing semiconductor device 10 from the growth chamber, the process is very simple, contamination free, and cost effective. Also, the disclosed process is compatible with the existing process flow. Semiconductor devices formed with an interface of DUV oxide between the semiconductor surface and the passivation material show superior saturation current and superior breakdown voltage characteristics compared with semiconductor devices not including the DUV oxide. While the DUV oxide interface is thought to be more beneficial when used with compound semiconductor materials (e.g. GaAs, etc.) where native oxides are less stable than in silicon devices, the present procedure does add some benefits in silicon devices also. Thus, the present procedure is especially useful for passivating critical surfaces (e.g. gate-drain areas, etc.) of semiconductor devices formed of compound semiconductor materials.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of passivating semiconductor devices comprising the steps of:

providing a semiconductor device including at least one electrode and having a surface of semiconductor material to be passivated adjacent the one electrode;

exposing the surface of semiconductor material to deep ultra-violet radiation in a gas ambiance including oxygen so as to form a layer of DUV oxide by oxidation of the surface of semiconductor material; and forming a layer of passivation material on the layer of DUV oxide.

2. A method of passivating semiconductor devices as claimed in claim 1 wherein the step of providing a semiconductor device having a surface of semiconductor material includes the step of desorbing native oxide from the surface of semiconductor material.

3. A method of passivating semiconductor devices as claimed in claim 2 wherein the step of desorbing native oxide includes heating the surface of semiconductor material in an oxygen free atmosphere.

4. A method of passivating semiconductor devices as claimed in claim 1 wherein the step of forming a layer of passivation material includes depositing a layer of one of $Si_3N_4$ or $SiO_2$.

5. A method of passivating semiconductor devices as claimed in claim 4 wherein the step of depositing a layer of one of $Si_3N_4$ or $SiO_2$ includes depositing by plasma enhanced chemical vapor deposition.

6. A method of passivating semiconductor devices as claimed in claim 1 wherein the step of providing a semiconductor device includes providing a semiconductor device having a surface of semiconductor material including compound semiconductor material positioned between the two electrodes.

7. A method of passivating semiconductor devices as claimed in claim 6 wherein the step of providing a semiconductor device includes providing one of a field effect transistor, a heterojunction bipolar transistor, or a diode.

8. A method of passivating semiconductor devices as claimed in claim 7 wherein the step of providing a semiconductor device includes providing a gallium arsenide field effect transistor.

9. A method of passivating semiconductor devices comprising the steps of:

providing a semiconductor device including at least one electrode and having a surface of compound semiconductor material to be passivated adjacent the one electrode, the surface including a layer of native oxide;

desorbing the layer of native oxide to expose the surface of compound semiconductor material;

exposing the surface of compound semiconductor material to deep ultra-violet radiation in a gas ambiance including oxygen so as to form a layer of DUV oxide by oxidation of the surface of compound semiconductor material; and forming a layer of passivation material on the layer of DUV oxide including the step of depositing a layer of one of $Si_3N_4$ or $SiO_2$ by plasma enhanced chemical vapor deposition on the layer of DUV oxide.

10. A method of passivating semiconductor devices as claimed in claim 9 wherein the step of providing a semiconductor device includes providing a semiconductor device including two spaced apart electrodes and having a surface of semiconductor material including compound semiconductor material positioned between the two electrodes.

11. A method of passivating semiconductor devices as claimed in claim 10 wherein the step of providing a semiconductor device includes providing one of a field effect transistor, a heterojunction bipolar transistor, or a diode.

12. A method of passivating semiconductor devices as claimed in claim 11 wherein the step of providing a semiconductor device includes providing a gallium arsenide field effect transistor.

* * * * *